(12) United States Patent
Jiang et al.

(10) Patent No.: US 9,960,105 B2
(45) Date of Patent: May 1, 2018

(54) CONTROLLED SOLDER HEIGHT PACKAGES AND ASSEMBLY PROCESSES

(71) Applicant: INTEL CORPORATION, Santa Clara, CA (US)

(72) Inventors: Hongin Jiang, Chandler, AZ (US); Arun Kumar C. Nallani, Chandler, AZ (US); Wei Tan, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 13/631,939

(22) Filed: Sep. 29, 2012

(65) Prior Publication Data

US 2014/0091457 A1    Apr. 3, 2014

(51) Int. Cl.
*H01L 23/498* (2006.01)
*H01L 23/48* (2006.01)
*H01L 21/48* (2006.01)

(52) U.S. Cl.
CPC .... *H01L 23/49811* (2013.01); *H01L 21/4853* (2013.01); *H01L 23/48* (2013.01); *H01L 23/49816* (2013.01); *H01L 2224/1403* (2013.01); *H01L 2224/14051* (2013.01); *H01L 2924/0002* (2013.01); *H01L 2924/15311* (2013.01); *H01L 2924/3511* (2013.01)

(58) Field of Classification Search
CPC ............... H01L 21/4853; H01L 23/48; H01L 23/49811; H01L 2924/15311; H01L 2924/3511
USPC ........ 257/737, 738, E21.508, 773, 777, 778, 257/780, E21.499, E21.506, E21.705, 257/E23.021; 438/107
See application file for complete search history.

(56) References Cited

U.S. PATENT DOCUMENTS

| | | | | |
|---|---|---|---|---|
| 5,539,153 | A | * | 7/1996 | Schwiebert et al. .......... 174/260 |
| 5,641,113 | A | * | 6/1997 | Somaki et al. .......... 228/180.22 |
| 5,641,946 | A | * | 6/1997 | Shim, II .............. H01L 21/4853 174/260 |
| 5,988,487 | A | * | 11/1999 | MacKay et al. ............... 228/254 |
| 6,443,351 | B1 | * | 9/2002 | Huang ................. B23K 3/0623 228/103 |
| 6,468,893 | B2 | * | 10/2002 | Ueoka .......................... 438/612 |
| 6,624,004 | B2 | * | 9/2003 | Lee .............................. 438/107 |

(Continued)

OTHER PUBLICATIONS

U.S. Appl. No. 13/626,869 to Sidhu et al., filed Sep. 25, 2012.
U.S. Appl. No. 13/601,788 to Ramalingam et al., filed Aug. 31, 2012.

*Primary Examiner* — Bilkis Jahan
*Assistant Examiner* — Victor Barzykin
(74) *Attorney, Agent, or Firm* — Konrad Raynes Davda & Victor LLP; Alan S. Raynes

(57) ABSTRACT

An apparatus comprises a substrate including a surface and a plurality of bonding pads positioned on the surface. The apparatus also includes a material comprising a solder positioned on the bonding pads and extending a distance outward therefrom. A first of the bonding pads in a first location on the substrate surface includes the solder extending a first distance outward therefrom. A second of the bonding pads in a second location on the substrate surface includes the solder extending a second distance outward therefrom. The first distance is different than the second distance. Other embodiments are described and claimed.

13 Claims, 6 Drawing Sheets

(56) References Cited

U.S. PATENT DOCUMENTS

| | | | |
|---|---|---|---|
| RE38,961 E * | 1/2006 | Okuno | H01L 21/56 438/106 |
| 7,312,529 B2 * | 12/2007 | Clevenger et al. | 257/738 |
| 7,378,297 B2 * | 5/2008 | Beyne | 438/108 |
| 7,534,715 B2 | 5/2009 | Jadhav et al. | |
| 7,651,021 B2 | 1/2010 | Supriya et al. | |
| 7,654,432 B2 * | 2/2010 | MacKay et al. | 228/39 |
| 7,737,552 B2 * | 6/2010 | Beyne | 257/724 |
| 7,795,743 B2 * | 9/2010 | Kim | H01L 23/3128 257/668 |
| 2002/0031868 A1 * | 3/2002 | Capote et al. | 438/126 |
| 2002/0068381 A1 * | 6/2002 | Ference et al. | 438/108 |
| 2003/0030457 A1 * | 2/2003 | Akram | 324/755 |
| 2003/0114024 A1 * | 6/2003 | Miyagawa | 439/68 |
| 2008/0003804 A1 * | 1/2008 | Nalla et al. | 438/613 |
| 2009/0065678 A1 * | 3/2009 | Vandermeulen et al. | 250/206 |
| 2011/0248398 A1 * | 10/2011 | Parvarandeh | H01L 24/06 257/737 |
| 2012/0273935 A1 | 11/2012 | Martens et al. | |
| 2013/0341379 A1 | 12/2013 | Sidhu et al. | |

* cited by examiner

CONTROLLED SOLDER HEIGHT PACKAGES AND ASSEMBLY PROCESSES

BACKGROUND

Ball grid array (BGA) packages are often used for connections such as second level interconnects, between a package substrate and a printed circuit board (PCB). As electronic devices become smaller and distances between adjacent connections become smaller, the risk of forming unreliable solder interconnects increases.

BRIEF DESCRIPTION OF THE DRAWINGS

Embodiments are described by way of example, with reference to the accompanying drawings, which are not necessarily drawn to scale.

DETAILED DESCRIPTION

In order to show features of various embodiments most clearly, the drawings included herein include a representation of various electronic and/or mechanical devices. The actual appearance of the fabricated structures may appear different while still incorporating the claimed structures of the illustrated embodiments. Moreover, the drawings may show only the structures necessary to understand the illustrated embodiments. For example, in certain figures only a small number of interconnection structures are illustrated, whereas in typical configurations, there are a large number of interconnection structures. Additional structures have not been included to maintain the clarity of the drawings.

Certain surface mount technology (SMT) processes for forming interconnections such as BGA solder interconnections between a package substrate and a PCB include the positioning of solder balls onto substrate bonding pads. The solder balls are uniform in size so a uniform amount of solder is placed on each pad. However, thermal expansion mismatch between the substrate and a die structure positioned thereon may cause the substrate to warp and bend in a manner that bends the BGA surface into a concave shape. As the substrate is aligned with the PCB and heated, the substrate begins to flatten out with the increased temperature and at the reflow temperature the substrate converts to a convex shape on the BGA surface. This shape moves the solder bumps in the central portion of the substrate towards the PCB, and moves the solder bumps in the outer portion of the substrate away from the PCB. Such movement increases the risk of center portion solder bump bridging (adjacent bumps contacting each other, which can result in electrical shorting) and outer portion solder bump opens (no electrical connection between the substrate and PCB) during the SMT process. Such risks may be minimized in accordance with certain embodiments.

Figure 1:
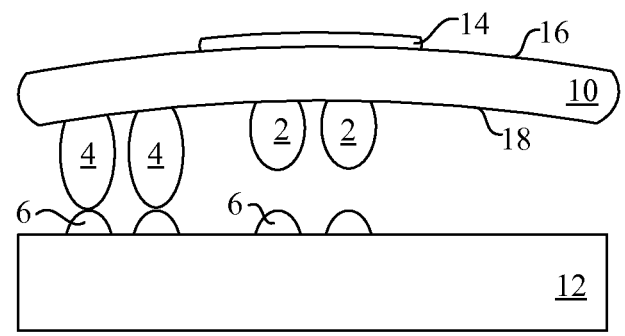
FIG. 1 illustrate a package substrate positioned above a PCB prior to heating to a reflow temperature, in accordance with certain embodiments.

Certain embodiments relating to the formation of interconnection structures will be discussed in connection with the Figures. FIG. 1 illustrates a package including a substrate 10 to be positioned on a printed circuit board (PCB) 12. The substrate 10 includes one or more die structures 14 positioned on a first surface 16 thereof. The die structure 14 may in certain embodiments be a semiconductor such as silicon. The substrate 10 will be coupled to the PCB 12 through solder connections, including solder regions 2, 4 positioned on a second surface 18 of the substrate 10, and the solder regions 6 on the PCB.

During processes for attaching the die structure 14 to the substrate 10, thermal expansion mismatch stresses between the die structure 14 and the substrate 10 (which may be formed from an organic polymeric material) often lead to warpage of the substrate 10, as illustrated in FIG. 1. As illustrated, the substrate 10 has a center portion at a higher vertical position than outer portions of the substrate 10.

In accordance with certain embodiments, the amount of solder positioned on the second surface 18 of the substrate 10 is varied in different locations, with a center portion including a smaller volume of solder, and an outer portion including a larger volume of solder. FIG. 1 illustrates two central solder regions 2, and two outer solder regions 4. The PCB 12 includes solder regions 6. The solder regions 2, 4 on the substrate 10 may be formed from solder balls and/or solder paste. The solder regions 6 may be formed from solder paste. Additional solder regions will typically be present on both the substrate 10 and PCB 12 but are not shown for clarity. As illustrated in FIG. 1, the central solder regions 2 on the substrate 10 have a smaller volume of solder than the outer solder regions 4. In addition, the warpage causes the central solder regions 2 to be lifted up relative to the outer solder regions 4. As a result, the central solder regions 2 are spaced a greater distance away from the PCB 12 than the outer solder regions 4.

Figure 2:
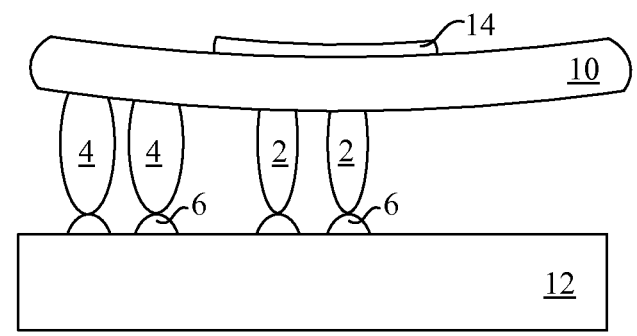
FIG. 2 illustrates the package substrate of FIG. 1, at reflow temperature but prior to joint formation, in accordance with certain embodiments.

FIG. 2 illustrates the package of FIG. 1 at reflow temperature (for example, 230° C.) but just prior to the formation of the solder joint between the substrate 10 and PCB 12. The change in temperature (from room temperature to reflow temperature) has caused the substrate 10 to warp in an opposite manner from the configuration in FIG. 1, with the center solder regions 2 being moved towards the PCB 12 and the outer solder regions 4 being moved away from the PCB 12. The combination of the change in warpage and the melting of the solder have brought the center solder regions 2 just into contact with adjacent solder paste regions 6 on the PCB 12. The outer solder regions 4 are also just in contact with adjacent solder paste regions 6 on the PCB 12.

Figure 3:
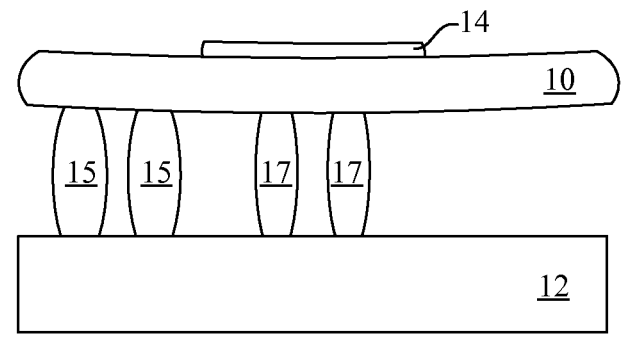
FIG. 3 illustrates the package substrate of FIGS. 1-2, after a joint has been formed, in accordance with certain embodiments.

FIG. 3 illustrates the package of FIGS. 1-2 after the solder joint formation is complete and the package has been brought back to room temperature. The change in temperature has caused the substrate 10 to warp or bend back towards a more flat configuration than the warpage at reflow temperature. The interconnection includes solder joints 17 (each including the solder from a center solder region 2 and an adjacent solder paste region 6) and solder joints 15 (each including solder from an outer solder region 4 and an adjacent solder paste region 6).

Embodiments include a number of processes for forming a different volume of solder at different locations on the surface 18 of the substrate 10. Embodiments also include processes in which solder has a different height at different locations on the surface 18 of the substrate 10.

Figure 4A:
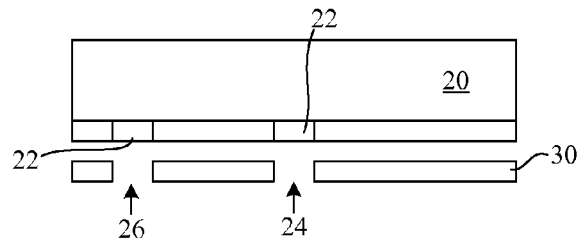
FIG. 4(A)-4(D) illustrate certain processing operations, in accordance with certain embodiments.
Figure 4B:
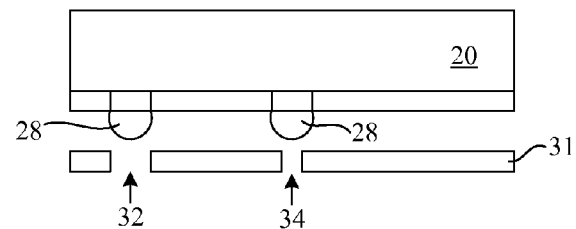

FIGS. 4(A)-4(D) illustrate certain processing operations in accordance with certain embodiments. FIG. 4(A) illustrates a substrate 20 including bonding pads 22. A stencil 30 having openings (apertures) 24, 26 is positioned adjacent to the substrate 20 for solder paste printing. Solder paste is printed onto the bonding pads 22 through the stencil 30 using any suitable process. A heating operation is carried out to reflow and form solder regions 28 bonded to the bonding pads 22. The solder regions 28 are illustrated in FIG. 4(B). After the reflow operation, another solder paste print will be carried out using stencil 31. The stencil 31 includes openings 32, 34. The openings 32, 34 are different sizes, with outer opening 32 being larger than central opening 34. This enables varying amounts of solder paste to be printed onto the substrate at different locations, depending on the presence of and sizes of the openings. In certain embodiments, certain of the opening(s) may not be necessary if no additional solder is needed in a particular location.

Figure 4C:
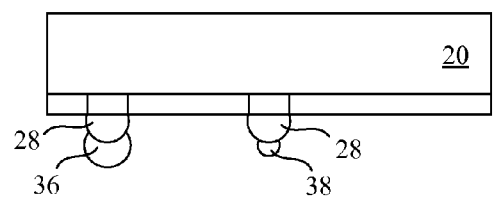
Figure 4D:
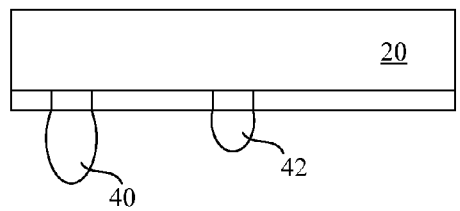

FIG. 4(C) illustrates the solder paste regions 36, 38 printed onto the reflowed solder regions 28 on the bonding pads 22. The solder paste region 38 has a smaller volume than the solder paste region 36, due to the smaller opening size of the central opening 34 in the stencil. Another heating operation is carried out to reflow the solder paste 36, 38 and combine it with the underlying reflowed solder 28 to form solder regions 40, 42, as illustrated in FIG. 4(D). Solder region 42 has less solder and extends a smaller distance away from the bonding pad 22 than solder region 40. Such a configuration is similar to that illustrated in FIG. 1 and attachment of the substrate 20 to a PCB may proceed in accordance with the description above in connection with FIGS. 1-3. The solder regions 40, 42 are at vertical positions such that when a reflow operation is carried out to couple the substrate 20 to a PCB, the outer solder region 40 may move upwards and the central solder region 42 downwards, which leads to the formation of a solder joint with a minimized risk of solder bridging between adjacent solder regions and a minimized risk for forming open regions between the substrate and PCB.

Figure 5A:
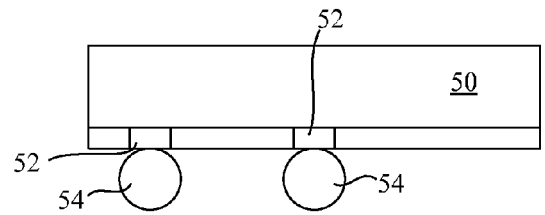
FIG. 5(A)-5(D) illustrate certain processing operations, in accordance with certain embodiments.
Figure 5B:
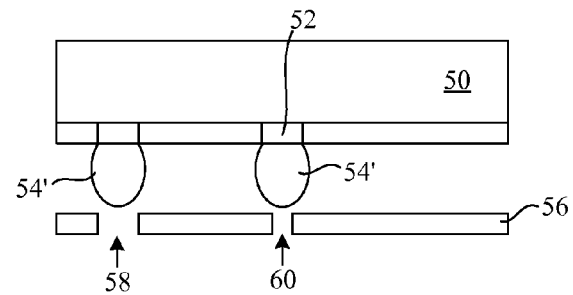

FIGS. 5(A)-5(D) illustrate certain processing operations in accordance with certain embodiments. FIG. 5(A) illustrates a substrate 50 including bonding pads 52. Solder balls 54 are positioned on the bonding pads 52, using any suitable process. The solder balls 54 may be positioned on flux (not shown) on the solder pads 52 in order to hold the solder balls 54 in place prior to reflow. A reflow operation is then conducted to enable the solder to wet and form a good connection with the bonding pad 52. A stencil 56 having openings 58, 60 is positioned adjacent to the substrate 50 for solder paste printing onto the reflowed solder balls 54' that are bonded to the bonding pads 52. The openings 58, 60 are different sizes, with outer opening 58 being larger than central opening 60. This enables varying amounts of solder paste to be printed onto the substrate at different locations, depending on the presence of and size of the openings.

Figure 5C:
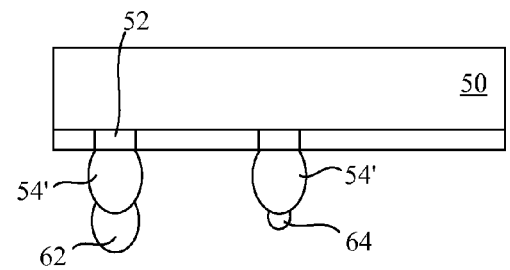
Figure 5D:
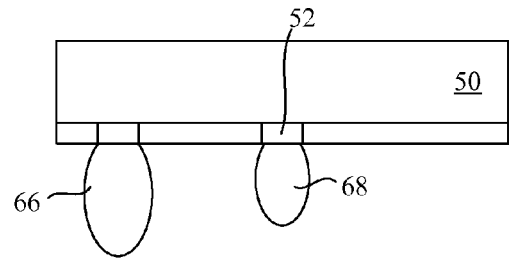

FIG. 5(C) illustrates the solder paste regions 62, 64 printed onto the reflowed solder balls 54'. The solder paste region 64 has a smaller volume than the solder paste region 62, due to the smaller opening 60 in the center of the stencil 56. Another heating operation is carried out to reflow the solder paste 62, 64 and combine it with the underlying reflowed solder 54' to form solder regions 66, 68, as illustrated in FIG. 5(D). Solder region 68 has less solder and extends a smaller distance away from the bonding pad 52 than solder region 66. Such a configuration is similar to that illustrated in FIG. 1 and attachment of the substrate 50 to a PCB may proceed in accordance with the description above in connection with FIGS. 1-3. The solder regions 66, 68 are at vertical positions such that when a reflow operation is carried out to couple the substrate 50 to a PCB, the outer solder region 66 may move upwards and the inner solder region 68 downwards, which leads to the formation of a solder joint with a minimized risk of solder bridging between adjacent solder regions and a minimized risk for forming open regions between the substrate and PCB.

Figure 6A:
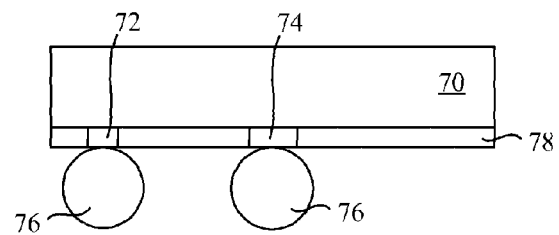
FIG. 6($a$)-6(B) illustrate certain processing operations, in accordance with certain embodiments.
Figure 6B:
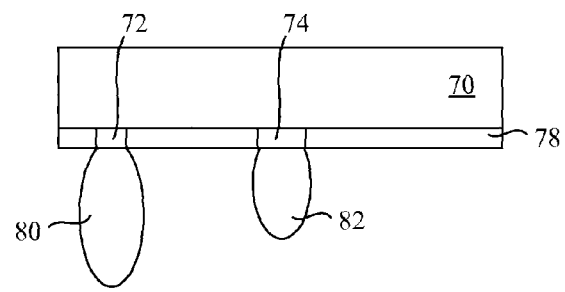

FIGS. 6(A)-6(B) illustrate certain processing operations in accordance with certain embodiments. FIG. 6(A) illustrates a substrate 70 including bonding pads 72, 74. Solder balls 76 are positioned on the bonding pads 72, 74 using any suitable process. The solder balls 74 may be positioned on flux (not shown) on the solder pads 72 in order to hold the solder balls 74 in place prior to reflow. The bonding pads 72, 74 may be formed using a solder resist layer 78 that is patterned to form openings that are filled with metal to form the bonding pads 72, 74. The openings in the solder resist layer 78 may be varied in size at different locations so that different sized bonding pads are formed. As illustrated in FIGS. 6(A)-6(B), the central bonding pad 74 has a width that is greater than that of the outer bonding pad 72.

The solder balls 76 placed on the bonding pads 72, 74 may be of uniform size. A reflow operation is then conducted to enable the solder to wet and form a good connection with the bonding pads 72, 74, as illustrated in FIG. 6(B). As a result of the outer bonding pad 72 having a smaller surface area to contact the solder than the central bonding pad 74, the resultant solder region 80 will be more narrow and longer than resultant solder region 82, even though the same size solder bumps 76 were used. Such a structure has a similar effect to positioning more solder material on the outer bonding pad in order to make it longer, as described in embodiments above. Attachment of the substrate 70 to a PCB may proceed in a similar manner as described above in connection with FIGS. 1-3. The solder regions 80, 82 are at vertical positions such that when a reflow operation is carried out to couple the substrate 70 to a PCB, the outer solder region 80 may move upwards and the inner solder region 82 downwards, which leads to the formation of a solder joint with a minimized risk of solder bridging between adjacent solder regions and a minimized risk for forming open regions between the substrate and PCB.

Figure 7A:
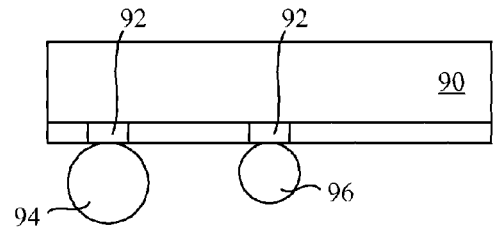
FIG. 7(A)-7(B) illustrate certain processing operations, in accordance with certain embodiments.
Figure 7B:
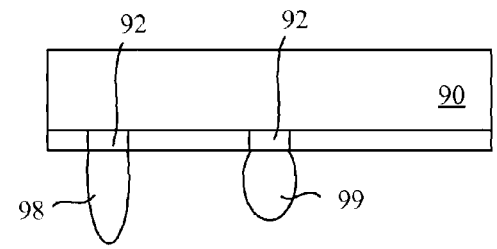

FIGS. 7(A)-7(B) illustrate certain processing operations in accordance with certain embodiments. FIG. 7(A) illustrates a substrate 90 including bonding pads 92. The illustrated bonding pads 92 in this embodiment each have the same area. Solder balls 94, 96 are positioned on the bonding pads 92 using any suitable process. The solder balls 94, 96 may be positioned on flux (not shown) on the bonding pads 92 in order to hold the solder balls 94, 96 in place prior to reflow. The solder balls 94, 96 are formed to be different sizes. As illustrated in FIG. 7(A), the central region solder ball 96 has a smaller diameter than the outer region solder ball 94. A reflow operation is conducted to wet the bonding pads 92 and form solder regions 98, 99, as illustrated in FIG. 7(B). Due to the larger volume of the solder ball 94, the solder region 98 is larger and longer than solder region 99. Attachment of the substrate 90 to a PCB may proceed in a similar manner as described above in connection with FIGS. 1-3. The solder regions 98, 99 are at vertical positions such that when a reflow operation is carried out to couple the substrate 90 to a PCB, the outer solder region 98 may move upwards and the central solder region 99 downwards, which leads to the formation of a solder joint with a minimized risk of solder bridging between adjacent solder regions and a minimized risk for forming open regions between the substrate and PCB.

It should be appreciated that in certain embodiments, the distance that the solder extends outward from the surface may sequentially change depending on the location on the surface and the expected warpage to be compensated for.

Figure 8:
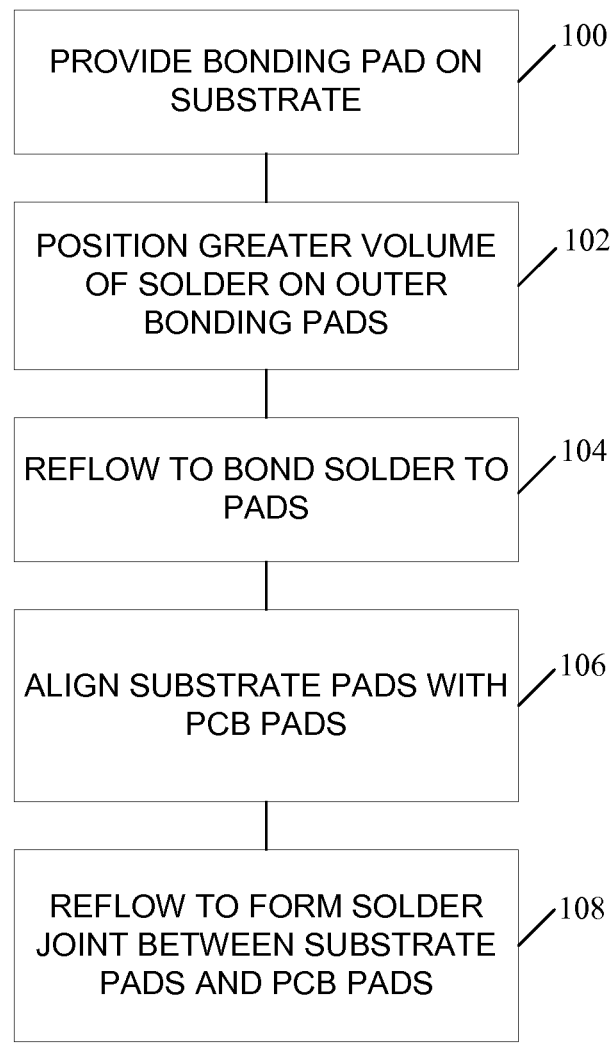
FIG. 8 illustrates a flow chart of process operations, in accordance with certain embodiments.

FIG. 8 is a flowchart of operations in accordance with certain embodiments. Box 100 is providing bonding pads on a substrate. Box 102 is positioning a greater volume of solder on outer bonding pads than on inner bonding pads. The solder may include, but is not limited to, solder paste and solder balls. Box 104 is performing a reflow operation to bond the solder to the bonding pads. Box 106 is aligning the substrate pads having the solder thereon with PCB pads. The PCB pad will typically include solder paste thereon. Box 108 is performing another reflow operation to form a solder joint between the substrate and the PCB.

Figure 9:
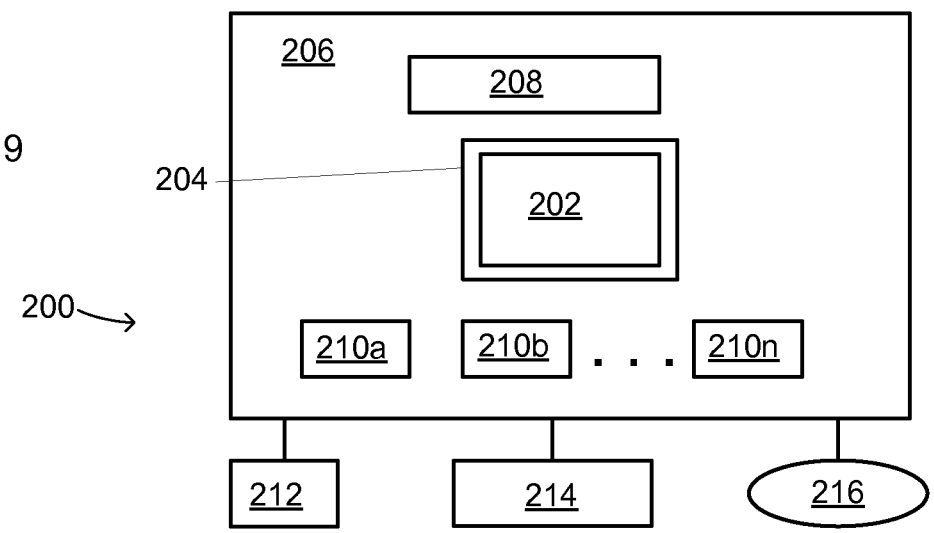
FIG. 9 illustrates an electronic system arrangement in which embodiments may find application.

Assemblies including components formed as described in embodiments above may find application in a variety of electronic components. FIG. 9 schematically illustrates one example of an electronic system environment in which aspects of described embodiments may be embodied. Other embodiments need not include all of the features specified in FIG. 4, and may include alternative features not specified in FIG. 9.

The system 200 of FIG. 4 may include at least one die 202 positioned on a package substrate 204, which is then coupled to a PCB 206. The package substrate 204 coupled to the board 206 is an example of an electronic device assembly that may be formed in accordance with embodiments such as described above. A variety of other system components, including, but not limited to memory and other components discussed below, may also include structures formed in accordance with the embodiments described above.

The system 200 may further include memory 208 and one or more controllers 210a, 210b . . . 210n, which may also be disposed on the PCB 206. The system may include a variety of other components, including, but not limited to, storage 212, display 214, and network connection 216. The system 200 may comprise any suitable computing device, including, but not limited to, a mainframe, server, personal computer, workstation, laptop, tablet, netbook, handheld computer, handheld gaming device, handheld entertainment device (for example, MP3 (moving picture experts group layer-3 audio) player), PDA (personal digital assistant) smart phone or other telephony device (wireless or wired), network appliance, virtualization device, storage controller, network controller, router, etc.

It should be appreciated that many changes may be made within the scope of the embodiments described herein. The term die as used herein refers to a workpiece that is transformed by various process operations into a desired electronic device. A die is usually singulated from a wafer, and may be made of semiconducting, non-semiconducting, or combinations of semiconducting and non-semiconducting materials. Terms such as "first", "second", and the like, if used herein, do not necessarily denote any particular order, quantity, or importance, but are used to distinguish one element from another. Terms such as "top", "bottom", "upper", "lower", "over", "under", and the like are used for descriptive purposes and to provide a relative position and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed is:

1. An apparatus comprising:
    a substrate comprising a first substrate surface and a second substrate surface opposite the first substrate surface, the first substrate surface including a first bonding pad and a second bonding pad thereon, the first bonding pad positioned in a first location on an outer portion of the first substrate surface, the second bonding pad positioned on a central portion of the first substrate surface, the first bonding pad and the second bonding pad positioned to extend an equal distance outward from the first substrate surface, and a semiconductor die positioned on the second substrate surface;
    a solder resist positioned between the first bonding pad and the second bonding pad on the first substrate surface, wherein the solder resist layer extends from a side surface of the first bonding pad to a side surface of the second bonding pad, wherein the solder resist layer is in contact with the side surface of the first bonding pad and the side surface of the second bonding pad, the solder resist positioned to extend an equal distance outward from the first substrate surface to that of the first bonding pad and the second bonding pad at the side surface of the first bonding pad and at the side surface of the second bonding pad;
    a first amount of solder positioned on the first bonding pad;
    a second amount of solder positioned on the second bonding pad, wherein the first amount of solder is equal to the second amount of solder;
    the first bonding pad having a smaller area on which the solder is positioned than the second bonding pad;
    the solder on the first bonding pad extending a first distance outward therefrom; and
    the solder on the second bonding pad extending a second distance outward therefrom, wherein the first distance is greater than the second distance.

2. The apparatus of claim 1, further comprising additional bonding pads positioned on the first substrate surface.

3. A method comprising:
    providing a substrate comprising a first substrate surface and a second substrate surface opposite the first substrate surface, the first substrate surface including a plurality of bonding pads thereon, second substrate surface including a semiconductor die positioned thereon, the first substrate surface including a first bonding pad on an outer portion of the first substrate surface and a second bonding pad on a central portion of the first substrate surface, the first bonding pad having a smaller solder contact area than the second bonding pad, wherein the providing the first substrate surface including the plurality of bonding pads includes forming a solder resist layer, forming openings in the solder resist layer, and after the forming the openings in the solder resist layer, depositing a material comprising a metal in the openings to form the first bonding pad and the second bonding pad, the first bonding pad formed in a first opening, the second bonding pad formed in a second opening, wherein the first opening is smaller than the second opening, wherein the solder resist layer extends from a side surface of the first bonding pad to a side surface of the second bonding pad, wherein the solder resist layer is in contact with the side surface of the first bonding pad and the side surface of the second bonding pad, and wherein the solder resist layer is positioned to extend an equal distance outward from the first substrate surface to that of the first bonding pad and the second bonding pad at the side surface of the first bonding pad and at the side surface of the second bonding pad;

forming a first volume of solder on the solder contact area of the first bonding pad, so that the first volume of solder extends outward from the first bonding pad a first distance; and forming a second volume of solder on the solder contact area of the second bonding pad, so that the second volume of solder extends outward from the second bonding pad a second distance that is less than the first distance;

wherein the first volume is equal to the second volume.

4. The method of claim 3, wherein the forming the first volume and the forming the second volume comprises providing an amount of solder on the first bonding pad and an amount of solder on the second bonding pad and providing heat to form a reflowed solder region on the first bonding pad and a reflowed solder region on the second bonding pad.

5. The method of claim 4, further comprising, after the forming the first volume and the second volume, aligning the substrate with a printed circuit board and performing an additional heating to form a solder joint between the substrate and the printed circuit board through the first volume and the second volume.

6. The method of claim 3, wherein the forming the first volume and the forming the second volume comprises:
positioning a first solder ball on the first bonding pad and a second solder ball on the second bonding pad; and
heating the first solder ball and the second solder ball to a reflow temperature to form a reflowed solder region on the first bonding pad and a reflowed solder region on the second bonding pad.

7. The method of claim 6, further comprising, after the forming the first volume and the second volume, aligning the substrate with a printed circuit board and performing an additional heating to form a solder joint between the substrate and the printed circuit board through the first volume and the second volume.

8. The method of claim 3, further comprising forming additional openings in the solder resist layer between the first opening and the second opening, and forming additional bonding pads in the additional openings.

9. The method of claim 3, further comprising forming the solder resist to extend a distance outward from the first substrate surface, and forming the first bonding pad and the second bonding pad to extend an equal distance outward from the first substrate surface to that of the solder resist.

10. The method of claim 3, further comprising forming the first bonding pad and the second bonding pad to have a thickness equal to that of the solder resist.

11. A method comprising:
providing a substrate including a first side and a second side opposite the first side, the first side including a die positioned thereon, the second side including a first bonding pad and a second bonding pad and a solder resist layer extending from the first bonding pad to the second bonding pad, the solder resist layer positioned to extend an equal distance outward from the second side to that of the first bonding pad and the second bonding pad, wherein the first bonding pad has a size equal to that of the second bonding pad;
positioning equal amounts of solder on the first bonding pad and on the second bonding pad;
heating the equal amounts of solder to a reflow temperature to form a reflowed solder region on the first bonding pad and a reflowed solder region on the second bonding pad;
positioning additional solder on the reflowed solder region on the first bonding pad and on the reflowed solder region on the second bonding pad, wherein a different quantity of the additional solder is positioned on the reflowed solder region on the first bonding pad than is positioned on the reflowed solder region on the second bonding pad;
heating the additional solder and the reflowed solder region on the first bonding pad, and the additional solder and the reflowed solder region on the second bonding pad, to a reflow temperature to form a first volume of solder on the first bonding pad and a second volume of solder on the second bonding pad, wherein the first volume is different than the second volume; and
after the positioning the additional solder on the reflowed solder region on the first bonding pad and on the reflowed solder region on the second bonding pad, and after the heating the additional solder and the reflowed solder region on the first bonding pad, and the additional solder and the reflowed solder region on the second bonding pad, to the reflow temperature to form the first volume of solder on the first bonding pad and the second volume of solder on the second bonding pad, positioning the substrate to engage a printed circuit board.

12. The method of claim 11, wherein the positioning equal amounts of solder on the first bonding pad and on the second bonding pad comprises positioning a first solder ball on the first bonding pad and a second solder ball on the second bonding pad.

13. The method of claim 12, wherein the positioning additional solder comprises performing solder paste printing on the reflowed solder region on the first bonding pad and on the reflowed solder region on the second bonding pad.

* * * * *